(12) United States Patent
Nishikawa

(10) Patent No.: US 11,950,746 B2
(45) Date of Patent: Apr. 9, 2024

(54) CLEANING SYSTEM

(71) Applicant: Daifuku Co., Ltd., Osaka (JP)

(72) Inventor: Tadashi Nishikawa, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 107 days.

(21) Appl. No.: 17/366,482

(22) Filed: Jul. 2, 2021

(65) Prior Publication Data

US 2022/0061609 A1 Mar. 3, 2022

(30) Foreign Application Priority Data

Aug. 31, 2020 (JP) .................. 2020-145352

(51) Int. Cl.
| | | |
|---|---|---|
| A47L 7/00 | (2006.01) | |
| A47L 9/10 | (2006.01) | |
| A47L 9/28 | (2006.01) | |
| B08B 5/02 | (2006.01) | |
| B08B 5/04 | (2006.01) | |

(52) U.S. Cl.
CPC ............. *A47L 7/0085* (2013.01); *A47L 9/102* (2013.01); *A47L 9/2852* (2013.01); *A47L 2201/024* (2013.01); *A47L 2201/04* (2013.01); *B08B 5/02* (2013.01); *B08B 5/04* (2013.01)

(58) Field of Classification Search
CPC .. A47L 7/0085; A47L 2201/024; A47L 9/102; A47L 9/2852; A47L 2201/04; B08B 5/02; B08B 5/04
See application file for complete search history.

(56) References Cited

U.S. PATENT DOCUMENTS

| | | | |
|---|---|---|---|
| 2007/0157415 A1 | 7/2007 | Lee et al. | |
| 2015/0020343 A1* | 1/2015 | Shibata | B05B 15/68 |
| | | | 15/306.1 |
| 2017/0225904 A1* | 8/2017 | Murakami | B60L 5/005 |
| 2019/0115234 A1 | 4/2019 | Ogawa et al. | |
| 2019/0202064 A1* | 7/2019 | Wolff | A47L 9/2873 |
| 2020/0100640 A1* | 4/2020 | Marutani | A47L 11/4061 |

FOREIGN PATENT DOCUMENTS

| | | | | |
|---|---|---|---|---|
| JP | 2003180587 A | | 7/2003 | |
| JP | 2007181656 A | | 7/2007 | |
| JP | 2008214084 A | | 9/2008 | |
| JP | 201973349 A | | 5/2019 | |
| KR | 2008079075 A | * | 8/2008 | ............... A47L 9/00 |
| KR | 20080079075 A | * | 10/2008 | |

* cited by examiner

*Primary Examiner* — Eric J Rosen
*Assistant Examiner* — Robert C Moore
(74) *Attorney, Agent, or Firm* — The Webb Law Firm

(57) ABSTRACT

A cleaning system includes: a cleaning vehicle 1 that travels along a predetermined travel path R to clean the travel path; and a maintenance facility 2 provided at a maintenance stop position A set on the travel path R, wherein the cleaning vehicle 1 includes a suction portion 14 that sucks up dust on the travel path R, a storage portion that stores the sucked up dust, and a discharge portion 16 that discharges the dust stored in the storage portion to the outside, and the maintenance facility 2 includes a dust collection portion 214 that collects the dust discharged to the outside from the storage portion via the discharge portion 16 of the cleaning vehicle 1 stopped at the maintenance stop position A.

7 Claims, 8 Drawing Sheets

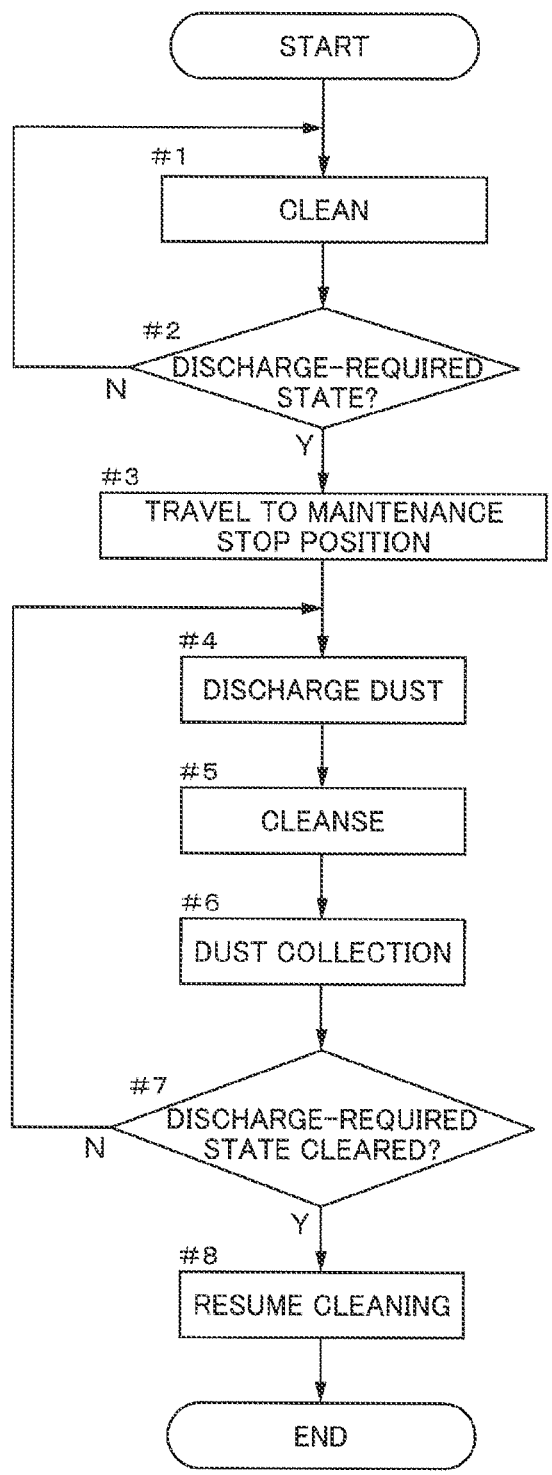

CLEANING SYSTEM

CROSS-REFERENCE TO RELATED APPLICATION

This application claims priority to Japanese Patent Application No. 2020-145352 filed Aug. 31, 2020, the disclosure of which is hereby incorporated by reference in its entirety.

BACKGROUND OF THE INVENTION

1. Field of the Invention

The present invention relates to a cleaning system including a cleaning vehicle that travels along a predetermined travel path to clean the travel path.

2. Description of Related Art

An example of such a cleaning system is disclosed in JP 2019-73349 (Patent Document 1). In the following, the reference numerals shown in parentheses in the description of the related art are those of Patent Document 1.

According to the technique disclosed in Patent Document 1, a cleaning vehicle (3) that travels along a travel path (R) includes a cleaner unit (34). Also, the cleaning vehicle (3) sucks up dust on the travel path (R) using the cleaner unit (34) while traveling along the travel path (R).

SUMMARY OF THE INVENTION

Meanwhile, Patent Document 1 does not particularly describe the processing of the dust that has been sucked up by the cleaner unit (34). For example, it is possible that the sucked up dust is processed by an operator at a location different from the travel path (R) after the cleaning vehicle (3) that has collected the dust is removed from the travel path (R). However, in this case, an operational burden corresponding to processing of the dust is imposed on the operator.

In view of the above-described circumstances, it is desirable to realize a technique that can reduce the burden on an operator in the case where dust collected by a cleaning vehicle is to be processed.

A cleaning system according to the present disclosure includes:

a cleaning vehicle that travels along a predetermined travel path to clean the travel path; and a maintenance facility provided at a maintenance stop position set on the travel path, wherein the cleaning vehicle includes a suction portion that sucks up dust on the travel path, a storage portion that stores the sucked up dust, and a discharge portion that discharges the dust stored in the storage portion to the outside, and the maintenance facility includes a dust collection portion that collects the dust discharged to the outside from the storage portion via the discharge portion of the cleaning vehicle stopped at the maintenance stop position.

With this configuration, the cleaning vehicle can travel to the maintenance stop position by itself after sucking up the dust on the travel path, and discharge the dust stored in the storage portion to the outside at the maintenance stop position. Then, the dust discharged from the cleaning vehicle can be automatically collected by the dust collection portion of the maintenance facility. Thus, with this configuration, the dust collected by the cleaning vehicle can be automatically processed. Accordingly, it is possible to reduce the burden on the operator at the time of processing the dust collected by the cleaning vehicle.

Further features and advantages of the technique according to the present disclosure will become apparent from the following description of illustrative and non-limiting embodiments with reference to the drawings.

BRIEF DESCRIPTION OF THE DRAWINGS

FIG. 9 is a flowchart illustrating processing of dust performed by the cleaning system.

DETAILED DESCRIPTION OF PREFERRED EMBODIMENTS

A cleaning system is a system that cleans a predetermined travel path and performs post-cleaning processing. Hereinafter, an embodiment of the cleaning system will be described, taking as an example, a case where the cleaning system is applied to an article transport facility.

Schematic Configuration of Article Transport Facility

Figure 1:
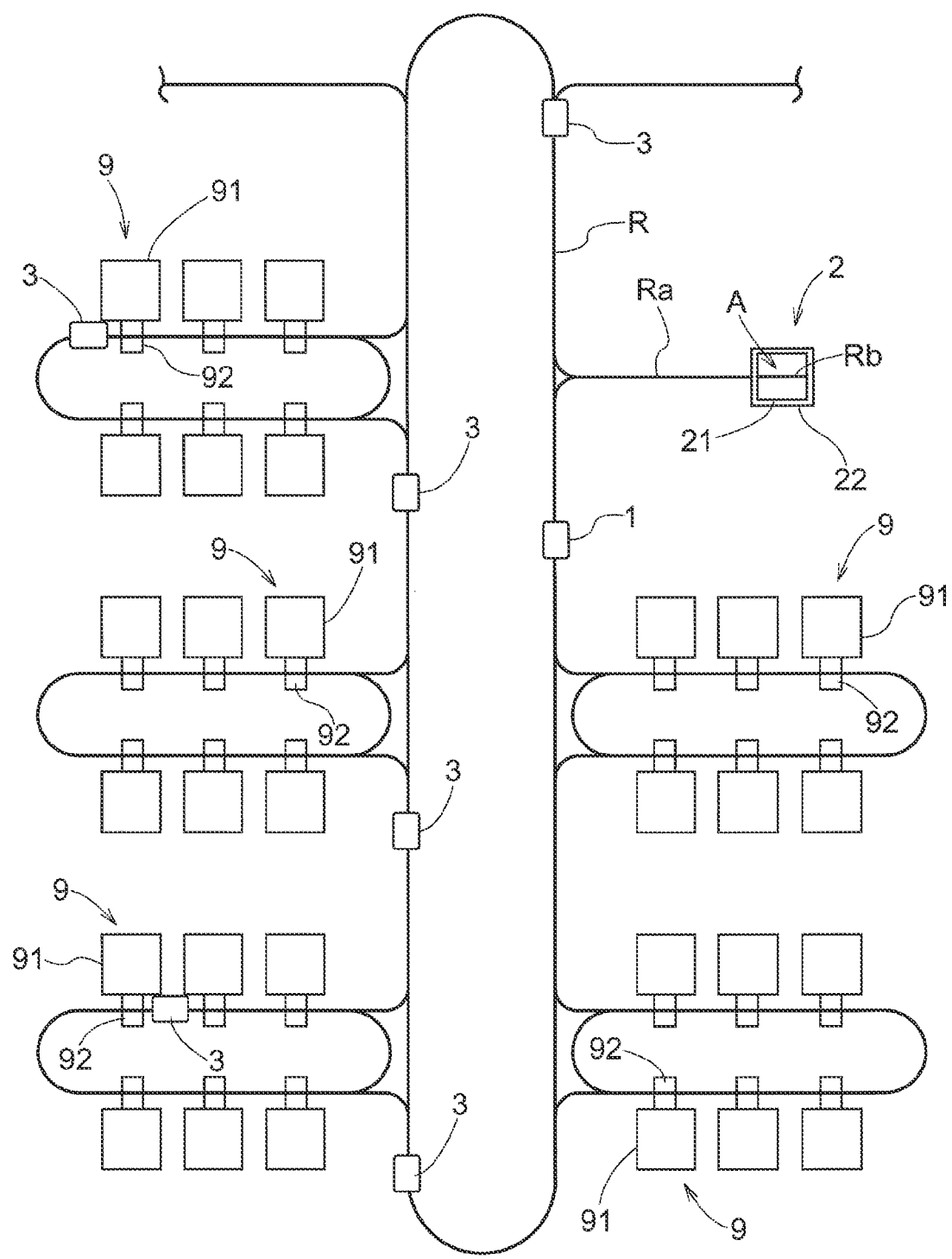
FIG. 1 is an overall plan view of an article transport facility including a cleaning system.
Figure 2:
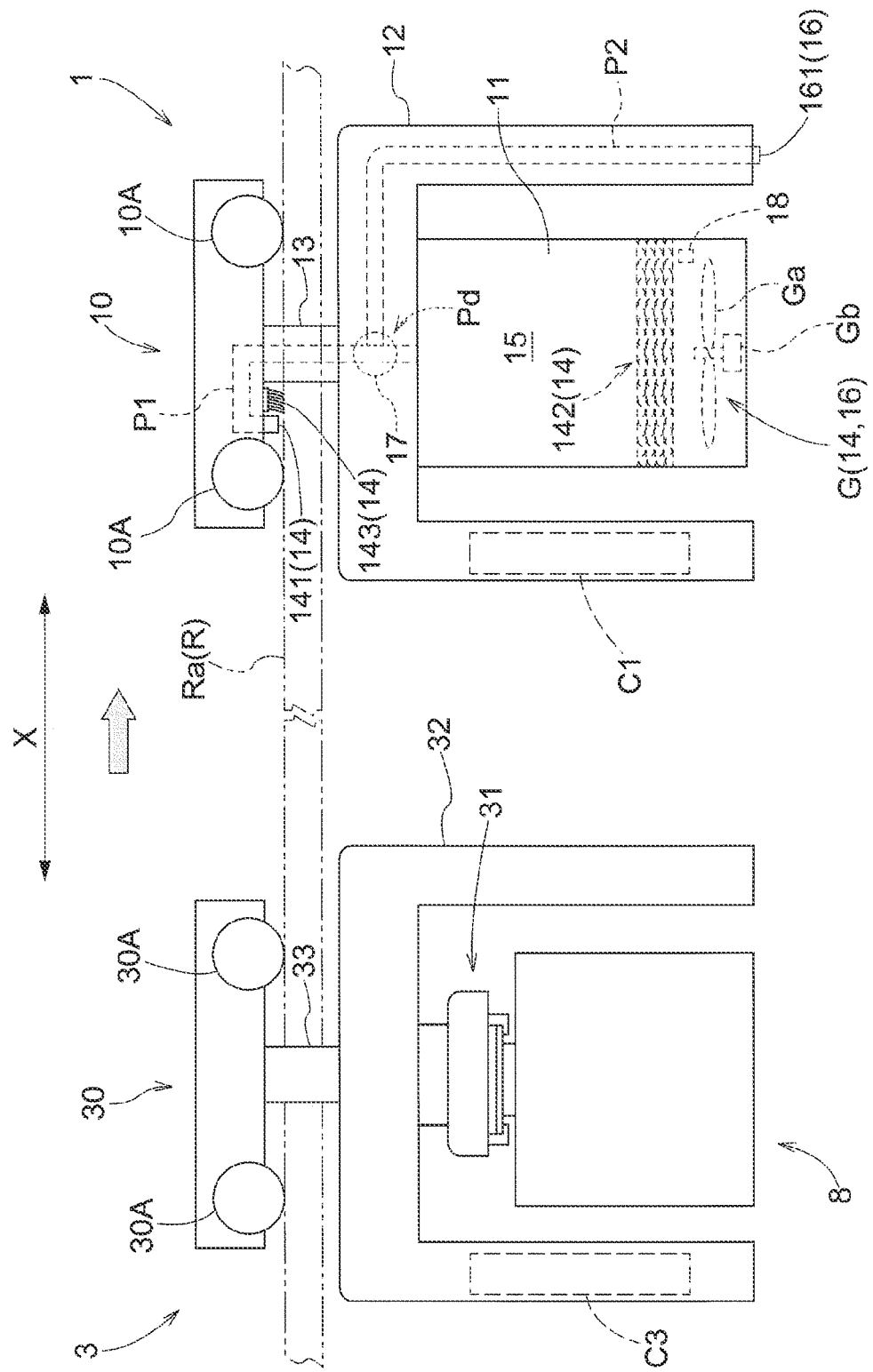
FIG. 2 is a side view of a cleaning vehicle and a transport vehicle.

As shown in FIGS. 1 and 2, the article transport facility includes a transport vehicle 3 that transports an article 8, a pair of rails Ra installed near the ceiling of the facility and constituting the travel path R of the transport vehicle 3, and a transfer target location 9 where the article 8 is transferred to and from the transport vehicle 3. That is, in the present example, the article transport facility is configured as a ceiling transport facility that transports the article 8 near the ceiling.

A processing device 91 that performs processing on the article 8, and a support platform 92 that is disposed adjacent to the processing device 91 and that supports the article 8 are provided at the transfer target location 9. In the present embodiment, the transport vehicle 3 transports, to the support platform 92, the article 8 not yet subjected to the processing performed by the processing device 91, and transports, from the support platform 92 to a designated transport destination, the article 8 subjected to the processing performed by the processing device 91. For example, the article 8 is a container that stores a processing target object that is to be subjected to the processing performed by the processing device 91. The above-described "processing performed on the article 8" means processing performed on the processing target object stored in the article 8. The article 8 may be a wafer storage container (a so-called front opening unified pod (FOUP)) that stores a wafer, or a reticle storage container (a so-called reticle pod) that stores a reticle. When the article 8 is an FOUP, the processing target object is a wafer. When the article 8 is a reticle pod, the processing target object is a reticle.

As shown in FIG. 2, the transport vehicle 3 includes a transport vehicle control device C3 that controls the transport vehicle 3, a travel mechanism 30 for traveling along the travel path R, and a transfer mechanism 31 for transferring the article 8. In the illustrated example, the transport vehicle 3 includes a cover portion 32 that surrounds the transfer mechanism 31, and a coupling portion 33 that couples the transfer mechanism 31 and the cover portion 32 to the travel mechanism 30. The travel mechanism 30 is disposed above the rails Ra. The transfer mechanism 31 and the cover portion 32 are coupled to the travel mechanism 30 by the coupling portion 33, and disposed below the rails Ra. The travel mechanism 30 and the transfer mechanism 31 are controlled by the transport vehicle control device C3.

The travel mechanism 30 includes a plurality of travel wheels 30A that roll on the rails Ra. In the present example, the plurality of travel wheels 30A are disposed separately on the left, right, front, and rear sides of the travel mechanism 30, and the travel mechanism 30 includes a total of four travel wheels 30A. At least one of the plurality of travel wheels 30A is driven by a travel motor, which is not shown, and provides the driving force for the transport vehicle 3 to travel along the travel path R.

The direction in which the transport vehicle 3 travels along the travel path R is defined as a traveling direction X, and a direction orthogonal to the traveling direction X in a plan view is defined as a width direction Y, and the cover portion 32 is disposed so as to cover the transfer mechanism 31 from opposite sides in the traveling direction X and the upper side. Opposite sides of the transfer mechanism 31 in the width direction Y are formed as openings, and are not covered by the cover portion 32.

The transfer mechanism 31 transfers the article 8 between the cover portion 32 and the transfer target location 9. Although detailed descriptions are omitted, the transfer mechanism 31 includes, for example, a gripping portion for gripping the article 8, and an elevation portion for elevating and lowering the article 8 to and from a support platform 92 (transfer target location 9) disposed below the rails Ra. In addition, the transfer mechanism 31 may include, as needed, a turning portion for changing the orientation of the article 8 to a proper orientation corresponding to the transfer target location 9, a sliding portion that slides the article 8 outward in the width direction Y from the cover portion 32, or the like. However, it is sufficient that the transfer mechanism 31 includes a configuration required to transfer the article 8 to and from the transfer target location 9, and is not limited to the above-described configuration.

Cleaning System

The cleaning system according to the present embodiment is provided in the above-described article transport facility. As shown in FIG. 1, the cleaning system includes a cleaning vehicle 1 that travels along a predetermined travel path R to clean the travel path R, and a maintenance facility 2 provided at a maintenance stop position A set on the travel path R.

In the present embodiment, the travel path R that is to be cleaned by the cleaning vehicle 1 is the travel path R of the transport vehicle 3. In other words, the cleaning vehicle 1 and the transport vehicle 3 are configured to travel along the same travel path R. In the present example, the travel path R is formed by a pair of rails Ra disposed spaced apart from each other in the width direction Y. The pair of rails Ra are installed at a position spaced apart upward from the floor surface of the facility, and are suspended and supported from the ceiling, for example. In the present embodiment, the cleaning vehicle 1 cleans off the dust attached to the rails Ra. The dust is produced as a result of operations performed by devices included in the facility, and is produced, for example, due to wear or the like of the travel wheels 30A caused when the transport vehicle 3 travels on the rails Ra.

Cleaning Vehicle

In the following, the configuration of the cleaning vehicle 1 will be described with reference mainly to FIGS. 2 to 4.

As shown in FIG. 2, the cleaning vehicle 1 includes a cleaning vehicle control device C1 that controls the cleaning vehicle 1. In the present embodiment, the cleaning vehicle 1 includes a travel mechanism 10 for traveling along the travel path R, a body portion 11, a cover portion 12 that covers the body portion 11, and a coupling portion 13 for coupling the body portion 11 and the cover portion 12 to the travel mechanism 10. The travel mechanism 10 is disposed above the rails Ra. The body portion 11 and the cover portion 12 are coupled to the travel mechanism 10 by the coupling portion 13, and are disposed below the rails Ra. The travel mechanism 10 is controlled by the cleaning vehicle control device C1. Note that in the present embodiment, the cleaning vehicle control device C1 corresponds to a "control unit".

The travel mechanism 10 includes a plurality of travel wheels 10A that roll on the rails Ra. In the present example, the plurality of travel wheels 10A are disposed separately on the left, right, front, and rear sides of the travel mechanism 10, and the travel mechanism 10 includes a total of four travel wheels 10A. At least one of the plurality of travel wheels 10A is driven by a travel motor, which is not shown, and provides the driving force for the cleaning vehicle 1 to travel along the travel path R.

Thus, the configuration for the cleaning vehicle 1 to travel along the travel path R is substantially the same as the configuration for the above-described transport vehicle 3 to travel along the travel path R.

In the present embodiment, the cover portion 12 is disposed so as to cover the body portion 11 from opposite sides and the upper side of the traveling direction X. Opposite sides of the body portion 11 in the width direction Y are formed as openings, and are not covered by the cover portion 12.

The cleaning vehicle 1 includes a suction portion 14 that sucks up the dust on the travel path R, a storage portion 15 that stores the sucked up dust, and a discharge portion 16 that discharges the dust stored in the storage portion 15 to the outside.

In the present embodiment, the cleaning vehicle 1 includes a first pipe P1 in which a suction port 141 that sucks up dust is formed, and a second pipe P2 in which a discharge port 161 that discharges dust is formed. In the present example, a brush portion 143 that scrapes off the dust on the travel path R is provided at a position adjacent to the upstream side (front side) in the traveling direction X relative to the suction port 141. Accordingly, the dust attached to the travel path R can be easily loosened and sucked up through the suction port 141.

The suction port 141 is open toward the travel path R, more specifically, so as to oppose a portion of the rails Ra where dust is deposited (here, the upper surface of the rails Ra). The above-described brush portion 143 is disposed in contact with the dust deposition portion of the rails Ra, and is configured to slide along the dust deposition portion as the cleaning vehicle 1 travels. In the present example, the first pipe P1 including the suction port 141 is partly disposed inside the cover portion 12. The suction port 141 is connected to the storage portion 15, and the dust sucked up though the suction port 141 passes through the first pipe P1, and is stored in the storage portion 15. Note that in the present example, an end of the first pipe P1 that is located opposite to the suction port 141 is open toward the storage portion 15. Although a detailed illustration has been omitted, in the present example, a suction port 141 is provided so as to correspond to each of the two rails Ra. In other words, the first pipe P1 is formed as a branched pipe that is branched so as to correspond to the two rails Ra, and includes two suction ports 141 respectively opposing the two rails Ra.

The discharge port 161 is open toward the outside of the cleaning vehicle 1, more specifically, toward a space below the cleaning vehicle 1. The second pipe P2 including the discharge port 161 is partly disposed inside the cover portion 12. In the illustrated example, the distal end of the second pipe P2 protrudes downward from the cover portion 12. The discharge port 161 is formed at the distal end portion of the second pipe P2 that protrudes downward from the cover portion 12. The discharge port 161 is connected to the storage portion 15, and the dust discharged from the storage portion 15 passes through the second pipe P2, and is discharged from the discharge port 161 to the outside of the cleaning vehicle 1. Note that in the present example, the second pipe P2 is connected to the first pipe P1, and a branch portion Pd is formed at the connection portion between the first pipe P1 and the second pipe P2. In other words, an end of the second pipe P2 that is located opposite to the discharge port 161 is open to the first pipe P1.

The storage portion 15 is provided in the internal space of the body portion 11. In the present embodiment, the cleaning vehicle 1 includes an air flow generation portion G that generates air flows, and a filter 142 that captures dust. Also, the air flow generation portion G and the filter 142 are provided in the internal space of the body portion 11. That is, in the present example, the storage portion 15, the filter 142, and the air flow generation portion G are provided in the internal space of the body portion 11. Also, in the internal space of the body portion 11, the storage portion 15 and the air flow generation portion G are disposed separately on opposite sides across the filter 142.

In the present embodiment, the air flow generation portion G is configured to generate a suction air flow Fi (see FIG. 3) for sucking up dust through the suction port 141, and a discharge air flow Fo (see FIG. 4) for discharging dust from the discharge port 161. In the present example, the air flow generation portion G includes a fan Ga, and a driving portion Gb that drives the fan Ga.

In the present embodiment, the air flow generation portion G generates an air flow that moves along the vertical direction in the internal space of the body portion 11. In the present example, the fan Ga is disposed such that the rotation axis thereof extends along the vertical direction. Accordingly, it is possible to generate an air flow that moves along the vertical direction in the internal space of the body portion 11. In the present embodiment, in a state in which the air flow generation portion G generates the suction air flow Fi, an air flow moving from top to bottom is generated in the internal space of the body portion 11. In a state in which the air flow generation portion G generates the discharge air flow Fo, an air flow moving from bottom to top is generated in the internal space of the body portion 11. Note that, in the present example, the storage portion 15, the filter 142, and the air flow generation portion G are arranged in order from top to bottom in the internal space of the body portion 11.

Figure 3:
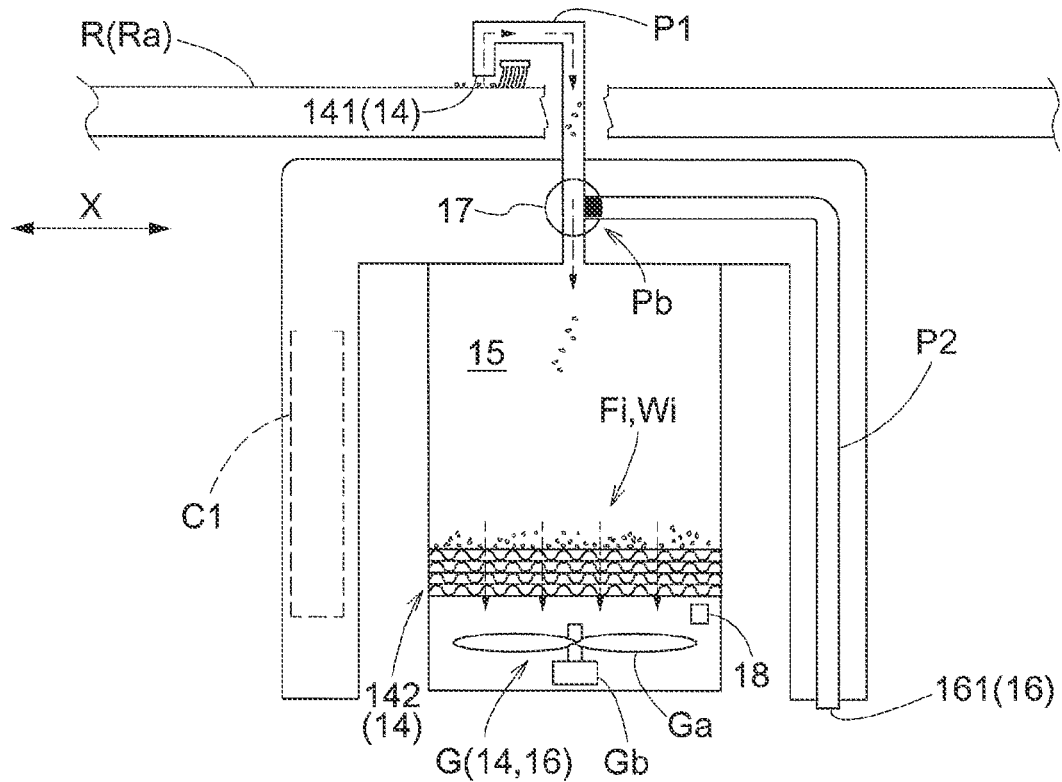
FIG. 3 is a diagram illustrating a state in which the cleaning vehicle is sucking up dust.

As shown in FIG. 3, the air flow generation portion G generates the suction air flow Fi by rotating the fan Ga. As a result of the air flow generation portion G generating the suction air flow Fi, a suction flow path Wi connecting the suction port 141 and the air flow generation portion G is formed. In the present embodiment, the storage portion 15 and the filter 142 are disposed on the suction flow path Wi connecting the suction port 141 and the air flow generation portion G. Also, the storage portion 15 is provided in a region on the suction port 141 side of the suction flow path Wi relative to the filter 142. Accordingly, in a state in which the air flow generation portion G generates the suction air flow Fi, dust that has been sucked up through the suction port 141 and is flowing along the suction flow path Wi is captured by the filter 142. The dust captured by the filter 142 is stored in the storage portion 15 disposed on the upstream side of the suction flow path Wi relative to the filter 142.

Figure 4:
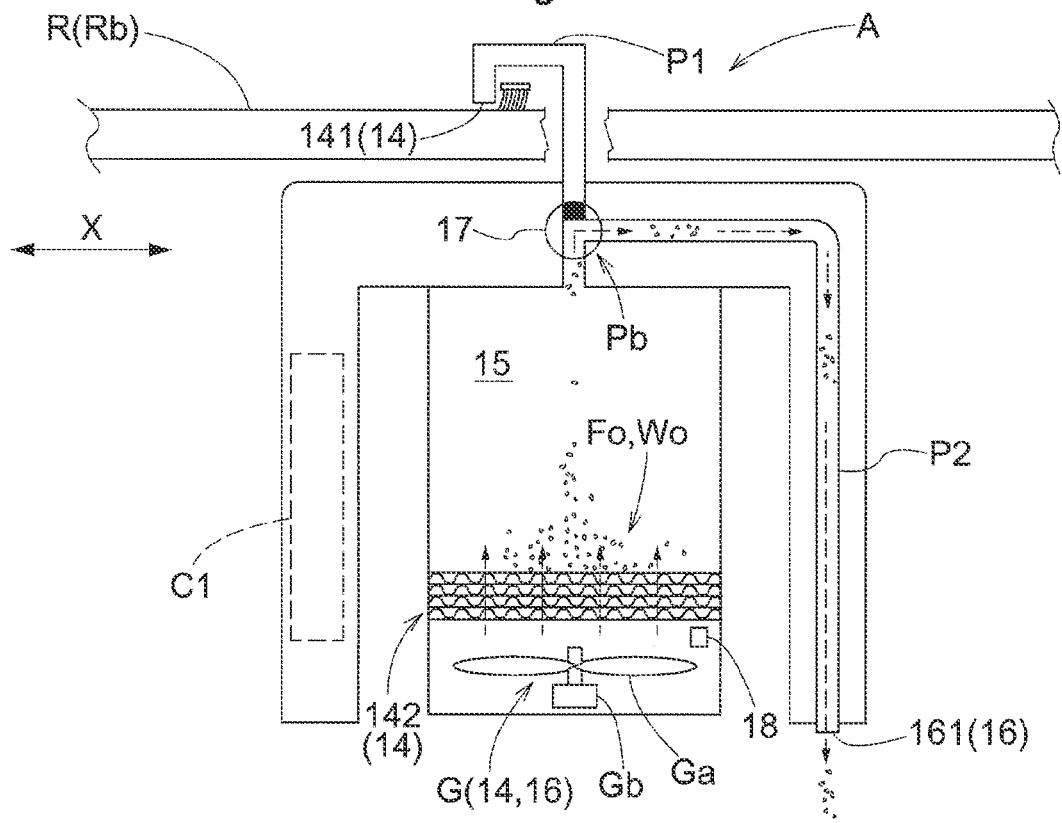
FIG. 4 is a diagram illustrating a state in which the cleaning vehicle is discharging dust.

As shown in FIG. 4, the air flow generation portion G generates a discharge air flow Fo that is an air flow moving in a direction opposite to the direction of the suction air flow Fi by rotating the fan Ga in a direction reverse to the direction in which the fan Ga is rotated when the suction air flow Fi is generated. As a result of the air flow generation portion G generating the discharge air flow Fo, a discharge flow path Wo connecting the discharge port 161 and the air flow generation portion G is formed. In the present embodiment, the storage portion 15 and the filter 142 are disposed on the discharge flow path Wo connecting the discharge port 161 and the air flow generation portion G. Also, the storage portion 15 is provided in a region on the discharge port 161 side of the discharge flow path Wo relative to the filter 142. Accordingly, in a state in which the air flow generation portion G generates the discharge air flow Fo, dust that has been captured by the filter 142 during suction and is stored in the storage portion 15 is separated from the filter 142, and flows through the discharge flow path Wo so as to be discharged from the discharge port 161 to the outside of the cleaning vehicle 1.

As described above, in the present embodiment, the suction portion 14 includes the suction port 141 formed so as to open toward the travel path R and be connected to the storage portion 15, the air flow generation portion G that generates the suction air flow Fi for sucking dust from the suction port 141, and the filter 142. In other words, the suction port 141, the air flow generation portion G, and the filter 142 constitute a part of the suction portion 14. Also, the suction portion 14 generates the suction air flow Fi by using the air flow generation portion G, thereby sucking up the dust deposited on the rails Ra through the suction port 141 and capturing the dust with the filter 142, and also storing the dust in the storage portion 15.

In the present embodiment, the discharge portion 16 includes the discharge port 161 connected to the storage portion 15, and the air flow generation portion G shared with the suction portion 14. In other words, the discharge port 161 and the air flow generation portion G constitute a part of the discharge portion 16. Also, the discharge portion 16 generates the discharge air flow Fo that is an air flow moving in a direction opposite to the direction in which the suction air flow Fi is generated by the air flow generation portion G, thereby discharging, from the discharge port 161, the dust that has been captured by the filter 142 and is stored in the storage portion 15.

Here, as described above, the suction flow path Wi is a flow path connecting the air flow generation portion G and the suction port 141, and the discharge flow path Wo is a flow path connecting the air flow generation portion G and the discharge port 161. In the present embodiment, the suction flow path Wi and the discharge flow path Wo partly overlap. Also, the cleaning vehicle 1 includes the branch portion Pd that branches the suction flow path Wi and the discharge flow path Wo. In the present example, the suction flow path Wi includes a region including a part of the internal space of the body portion 11 that extends from the air flow generation portion G to the filter 142 and the entire storage portion 15, and the entire region of the first pipe P1. The discharge flow path Wo includes a region including a part of the internal space of the body portion 11 that extends from the air flow generation portion G to the filter 142 and the entire the storage portion 15, a region of the first pipe P1 that extends from the connection portion with the storage portion 15 to the branch portion Pd, and the entire region of the second pipe P2.

In the present embodiment, the cleaning vehicle 1 further includes a flow path switching mechanism 17 disposed at the branch portion Pd. The flow path switching mechanism 17 is configured to be switchable between a first state (see FIG. 3) of allowing communication between the suction port 141 and the storage portion 15 and blocking communication between the discharge port 161 and the storage portion 15, and a second state (see FIG. 4) of blocking communication between the suction port 141 and the storage portion 15 and allowing communication between the discharge port 161 and the storage portion 15. Although a detailed illustration has been omitted, in the present embodiment, the flow path switching mechanism 17 is configured as a solenoid valve including a solenoid portion that converts electrical energy into a mechanical motion, and a valve portion that opens and closes flow paths. Any of various known methods can be adopted for the solenoid valve.

As shown in FIG. 3, as a result of the flow path switching mechanism 17 entering the first state, the entire suction flow path Wi is brought into communication. In the present embodiment, the air flow generation portion G generates the suction air flow Fi in the first state of the flow path switching mechanism 17. Consequently, the dust deposited on the rails Ra is sucked up through the suction port 141 and flows through the suction flow path Wi. The dust that has flowed through the suction flow path Wi is stored in the storage portion 15.

As shown in FIG. 4, as a result of the flow path switching mechanism 17 entering the second state, the entire discharge flow path Wo is brought into communication. In the present embodiment, the air flow generation portion G generates the discharge air flow Fo in the second state of the flow path switching mechanism 17. Consequently, the dust stored in the storage portion 15 is separated upward from the filter 142 and flows through the discharge flow path Wo. The dust that has flowed through the discharge flow path Wo is discharged from the discharge port 161 to the outside of the cleaning vehicle 1.

In the present embodiment, the cleaning vehicle 1 further includes a storage state detection portion 18 that detects the storage state of dust in the storage portion 15. Accordingly, the storage state of dust in the storage portion 15 can be known. The cleaning vehicle 1 discharges the dust in the storage portion 15 via the discharge portion 16, if the storage state is a discharge-required state in which the dust needs to be discharged from the storage portion 15.

In the present embodiment, the storage state detection portion 18 includes a pressure sensor that detects the pressure in the internal space of the body portion 11. Also, the storage state detection portion 18 detects the pressure in the internal space of the body portion 11 by using the pressure sensor, thereby detecting the storage state of dust in the storage portion 15. In the present example, the storage state detection portion 18 is configured to detect, as the storage state of dust, the pressure on the air flow generation portion G side of the suction flow path Wi relative to the filter 142 while the suction air flow Fi is generated. More specifically, when the amount of dust stored in the storage portion 15 increases, a large amount of dust is attached to the filter 142, thus making it difficult for the suction air flow Fi to pass through the filter 142. Accordingly, the pressure on the air flow generation portion G side relative to the filter 142 is reduced. The storage state detection portion 18 detects a decrease in pressure (pressure change) while the suction air flow Fi is generated. Accompanying a reduction in the pressure while the suction air flow Fi is generated on the air flow generation portion G side relative to the filter 142, the amount of dust attached to the filter 142 increases, and thus it is possible to determine that a large amount of dust is stored in the storage portion 15. In the present embodiment, the cleaning vehicle control device C1 determines that the storage state is the discharge-required state, if the pressure detected by the storage state detection portion 18 is less than or equal to a specified value. This specified value varies depending on the size of the space in which the storage state detection portion 18 serving as the pressure sensor measures the pressure, the suction force (the pressure of the suction air flow Fi) generated by the air flow generation portion G, the type of the filter 142, or the like, and is defined through experimentation or the like. Note that any of various known sensors can be used as the pressure sensor.

As described previously, the cleaning vehicle 1 is configured to perform suction and discharge of dust. As shown in FIG. 1, the cleaning vehicle 1 sucks up dust at any given position on the travel path R, but discharges dust at a maintenance stop position A set on the travel path R. As described above, the maintenance facility 2 is provided at the maintenance stop position A, and the maintenance facility 2 processes the dust collected by the cleaning vehicle 1.

Maintenance Facility

In the following, the configuration of the maintenance facility 2 will be described with reference mainly to FIGS. 1, 5 and 6.

As described above, the maintenance facility 2 is provided at the maintenance stop position A set on the travel path R. In the present embodiment, the maintenance stop position A is set at a section of the travel path R that is different from a section along which the article 8 is transported by the transport vehicle 3. Accordingly, it is possible to prevent the cleaning vehicle 1 or the transport vehicle 3 stopped at the maintenance stop position A from obstructing the transport vehicle 3 traveling toward a transport destination. Note that the maintenance facility 2 is configured to perform maintenance of not only the cleaning vehicle 1, but also the transport vehicle 3. When t the transport vehicle 3 requires maintenance, the transport vehicle 3 can travel to the maintenance stop position A, and undergo the maintenance performed by the maintenance facility 2.

Figure 5:
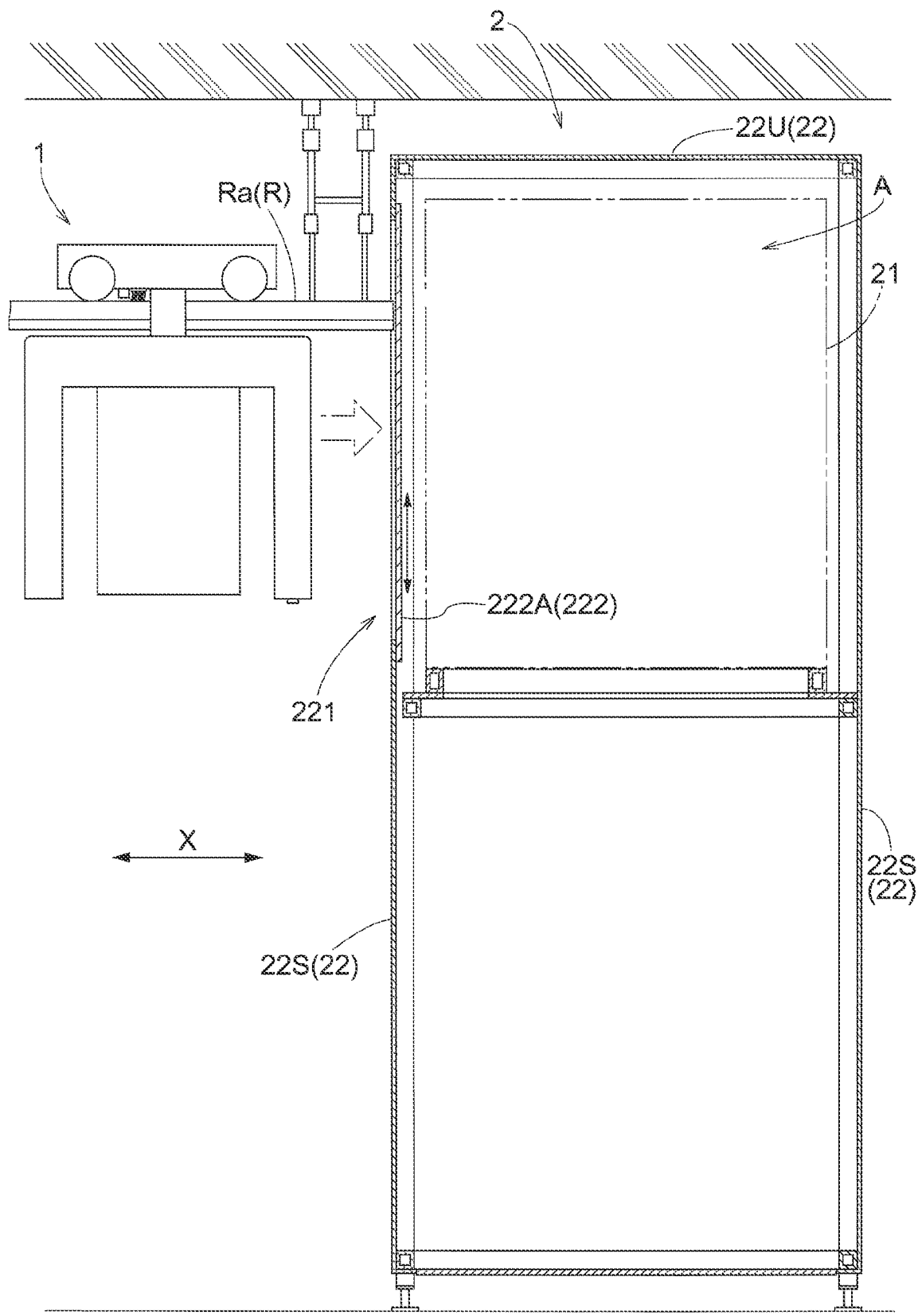
FIG. 5 is a side view of the vicinity of a maintenance facility.
Figure 6:
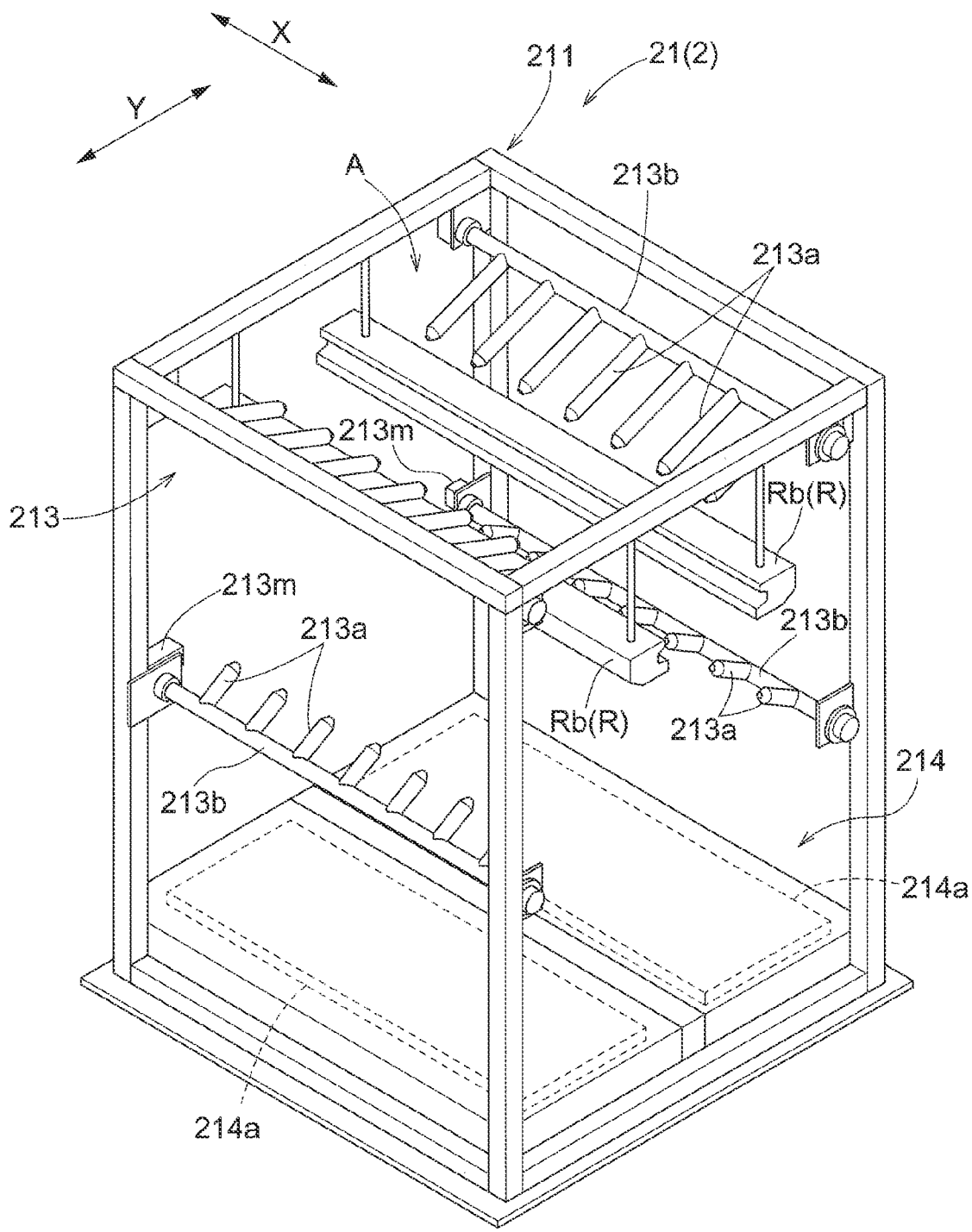
FIG. 6 is a perspective view showing a maintenance device including a cleansing portion and a dust collection portion.

As shown in FIGS. 1 and 5, the maintenance facility 2 includes a maintenance device 21, and a casing 22 surrounding the maintenance device 21. The maintenance facility 2 performs maintenance of the cleaning vehicle 1 or the transport vehicle 3 by using the maintenance device 21 inside the casing 22.

As shown in FIG. 5, the casing 22 includes an upper panel 22U that covers the top of the maintenance device 21, and four side panels 22S that cover the lateral sides of the maintenance device 21. Of the four side panels 22S, an opening 221 through which the cleaning vehicle 1 or the transport vehicle 3 traveling along the travel path R can pass is formed in the side panel 22S that overlaps the travel path R. In the present example, the opening 221 is formed in only one of the four side panels 22S.

In the present embodiment, the maintenance facility 2 includes a shutter 222 capable of opening/closing the opening 221 formed in the side panel 22S of the casing 22. The shutter 222 includes a shutter body 222A that is operated to be opened or closed between a closed position for closing the opening 221 and an open position for opening the opening 221, and an opening/closing motor (not shown) that drives the shutter body 222A so as to be opened or closed. In a state in which the shutter body 222A is at the open position, the cleaning vehicle 1 or the transport vehicle 3 can enter the inside of the casing 22.

The maintenance device 21 is disposed in a space surrounded by the casing 22. As shown in FIG. 6, the maintenance device 21 includes a support member 211 formed by a plurality of frame members that are coupled to each other in a frame shape, and rail bodies Rb that are supported by the support member 211 and that guide the cleaning vehicle 1 or the transport vehicle 3. Each rail body Rb is provided on an extension of the corresponding rail Ra, and guides the cleaning vehicle 1 or the transport vehicle 3 traveling on the rail Ra to the inside of the casing 22. In the present embodiment, the rail bodies Rb constitute a part of the travel path R, and the maintenance stop position A is set on the rail bodies Rb. Accordingly, the travel wheels 10A of the cleaning vehicle 1 and the travel wheels 30A of the transport vehicle 3 can roll on the rail bodies Rb. The cleaning vehicle 1 and the transport vehicle 3 can travel on the rail bodies Rb continuously from the rails Ra.

In the present embodiment, the maintenance facility 2 includes a cleansing portion 213 that cleanses the cleaning vehicle 1 and the transport vehicle 3 at the maintenance stop position A. In the present embodiment, the cleansing portion 213 is provided in the maintenance device 21. The cleansing portion 213 includes a plurality of nozzles 213a for ejecting air, and is configured to blow air at the cleaning vehicle 1 or the transport vehicle 3 (hereinafter may be collectively referred to as a "target vehicle") stopped at the maintenance stop position A. Thus, the cleansing portion 213 removes the dust attached to the target vehicle.

In the present embodiment, the cleansing portion 213 includes a nozzle supporting portion 213b that supports the plurality of nozzles 213a. In the present example, the nozzle supporting portion 213b is formed by a shaft-like member extending along the traveling direction X, and supports the plurality of nozzles 213a arranged along the traveling direction X. Each of the plurality of nozzles 213a is supported by the nozzle supporting portion 213b in an orientation in which an air ejection port formed therein faces the target vehicle stopped at the maintenance stop position A. Also, the nozzle supporting portion 213b is supported by the support member 211 so as to be rotatable about an axis extending along the traveling direction X. The nozzle supporting portion 213b is driven by a rotation motor 213m (nozzle driving portion) to rotate about the axis extending along the traveling direction X. As a result of the nozzle supporting portion 213b rotating, each of the plurality of nozzles 213a supported by the nozzle supporting portion 213b blows air at the target vehicle in a vertical range corresponding to the amount of rotation of the nozzle supporting portion 213b.

In the present embodiment, the cleansing portion 213 includes a plurality of the above-described nozzle supporting portions 213b. The plurality of nozzle supporting portions 213b are disposed on opposite sides in the width direction Y relative to the pair of rail bodies Rb. More specifically, on opposite sides in the width direction Y relative to the pair of rail bodies Rb, a portion of the plurality of nozzle supporting portions 213b are disposed above the pair of rail bodies Rb, and another portion of plurality of nozzle supporting portions 213b are disposed below the pair of rail bodies Rb. In the present example, a total of four nozzle supporting portions 213b are provided, and two of the nozzle supporting portions 213b are disposed above the pair of rail bodies Rb, and the remaining two nozzle supporting portions 213b are disposed below the pair of rail bodies Rb.

Figure 8:
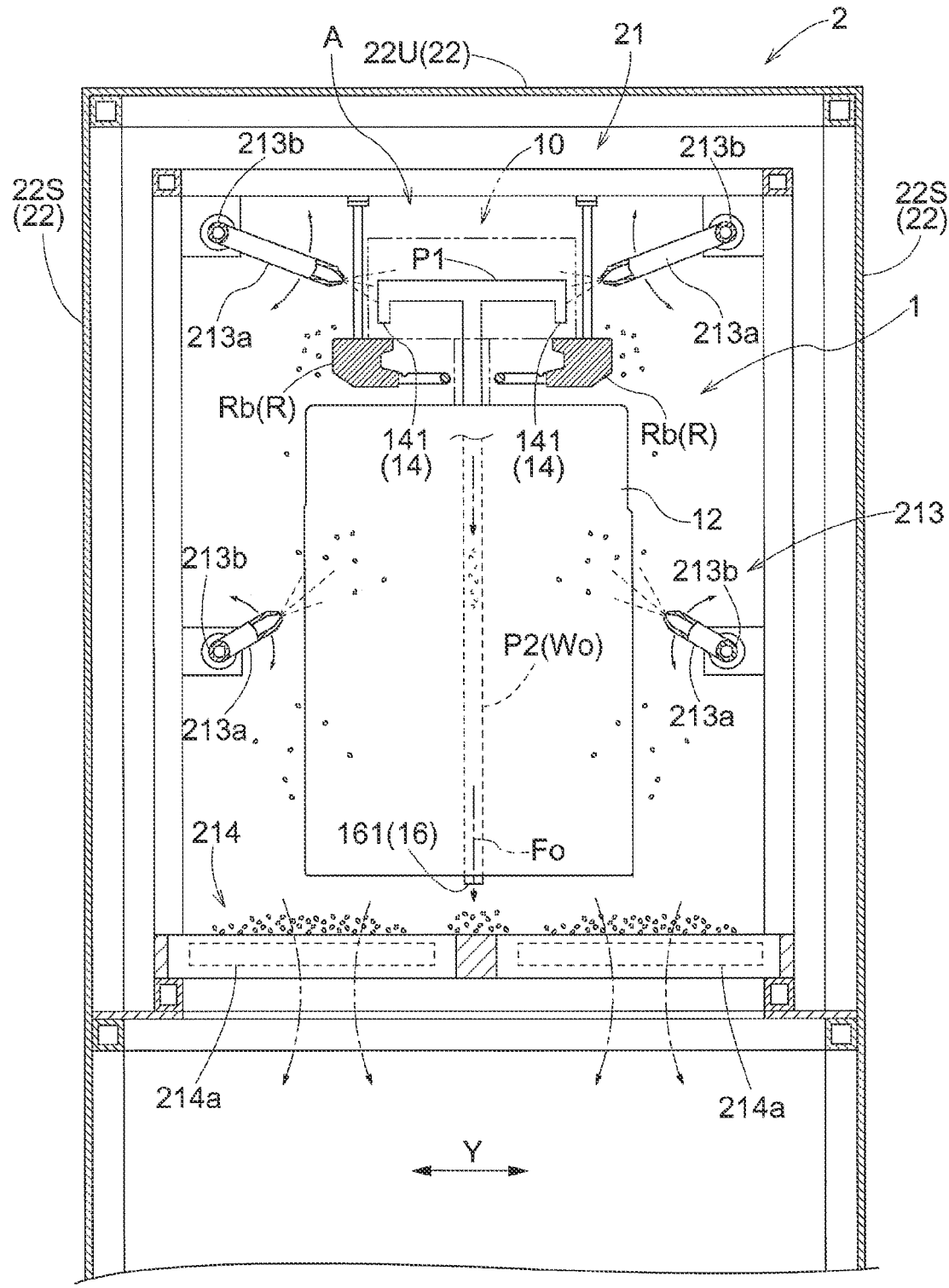
FIG. 8 is a front view showing a state in which the maintenance facility is collecting dust.

As shown in FIG. 8, when the target vehicle is the cleaning vehicle 1, the plurality of nozzles 213a supported by the nozzle supporting portions 213b disposed above the pair of rail bodies Rb blow air at the travel mechanism 10 of the cleaning vehicle 1. The plurality of nozzles 213a supported by the nozzle supporting portions 213b disposed below the pair of rail bodies Rb blow air at the body portion 11 (see FIG. 2) and the cover portion 12 of the cleaning vehicle 1. Thus, the entire cleaning vehicle 1 can be cleaned. Also when the target vehicle is the transport vehicle 3, the plurality of nozzles 213a supported by the respective nozzle supporting portions 213b blow air to the same locations as in the case where the nozzles 213a blow air at the cleaning vehicle 1. The dust removed from the target vehicle by the cleansing portion 213 is scattered in the internal space of the casing 22.

The maintenance facility 2 includes a dust collection portion 214 that collects the dust in the internal space of the casing 22. In the present embodiment, the dust collection portion 214 is provided in the maintenance device 21. The dust collection portion 214 is provided below the cleansing portion 213. In the present example, the dust collection portion 214 is supported by the lower end portion of the support member 211.

The dust collection portion 214 includes a fan filter unit 214a including a fan and a filter. In the illustrated example, two fan filter units 214a are arranged in the width direction Y. The dust collection portion 214 sucks the air in the internal space of the casing 22 by using the fans and discharges the air to the outside, and also captures the dust in the internal space of the casing 22 with the filters during sucking. Thus, the dust collection portion 214 collects the dust removed by the cleansing portion 213 from the cleaning vehicle 1 or the transport vehicle 3.

Here, as described above, the cleaning vehicle 1 discharges the dust sucked up from the travel path R at the maintenance stop position A. The dust collection portion 214 is configured to collect the dust discharged to the outside from the storage portion 15 by the discharge portion 16 of the cleaning vehicle 1 stopped at the maintenance stop position A. That is, the maintenance facility 2 includes a dust collection portion 214 that collects the dust discharged to the outside from the storage portion 15 by the discharge portion 16 of the cleaning vehicle 1 stopped at the maintenance stop position A.

Thus, with the cleaning system according to the present disclosure, the cleaning vehicle 1 can travel to the maintenance stop position A by itself after sucking up the dust on the travel path R, and discharge the dust stored in the storage portion 15 to the outside at the maintenance stop position A. Then, the dust discharged from the cleaning vehicle 1 can be automatically collected by the dust collection portion 214 of the maintenance facility 2. That is, with the cleaning system, the processing of the dust collected by the cleaning vehicle 1 can be automatically performed. Since the processing of the dust collected by the cleaning vehicle 1 can be performed in the maintenance facility 2 that performs the maintenance (cleansing) of the transport vehicle 3, the cleaning system can be easily introduced to, for example, an existing article transport facility including the maintenance facility 2.

In the present embodiment, when the cleaning vehicle 1 is stopped at the maintenance stop position A, the maintenance facility 2 collects in parallel with cleansing of the cleaning vehicle 1 performed by the cleansing portion 213, the dust discharged from the cleaning vehicle 1 by using the dust collection portion 214. Accordingly, the cleansing of the cleaning vehicle 1 and the processing of the dust collected by the cleaning vehicle 1 can be performed in parallel. This makes it possible to clean the cleaning vehicle 1 while the the dust collected by the cleaning vehicle 1 is processed.

Control Configuration

Next, the control configuration of the article transport facility and the cleaning system will be described with reference mainly to FIG. 7.

Figure 7:
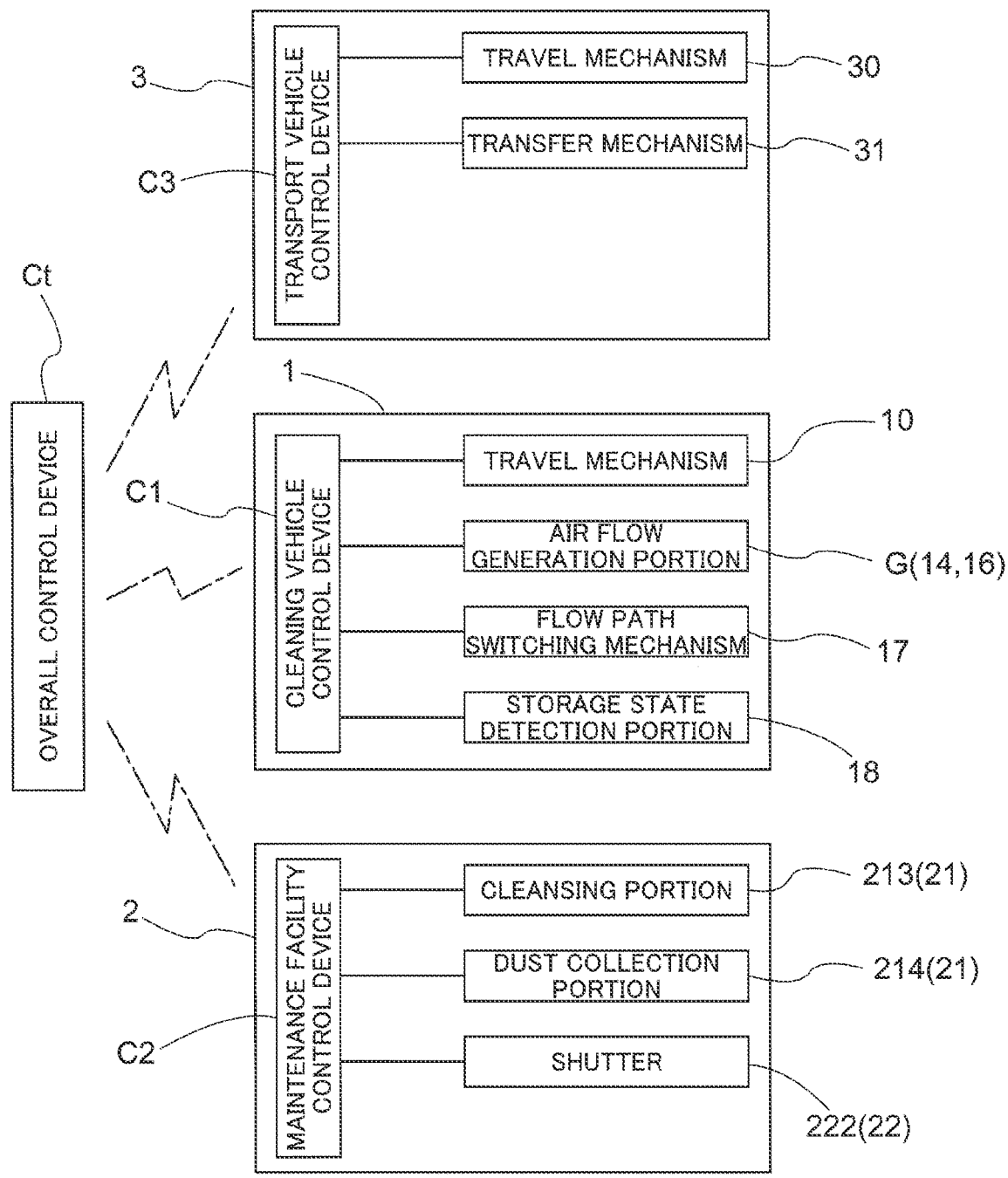
FIG. 7 is a control block diagram of the article transport facility including the cleaning system.

As shown in FIG. 7, the article transport facility includes an overall control device Ct that manages the entire facility, a transport vehicle control device C3 that controls the transport vehicle 3, a cleaning vehicle control device C1 that controls the cleaning vehicle 1, and a maintenance facility control device C2 that controls the maintenance facility 2. The transport vehicle control device C3 is provided in the transport vehicle 3, the cleaning vehicle control device C1 is provided in the cleaning vehicle 1, and the maintenance facility control device C2 is provided in the maintenance facility 2. These control devices each include, for example, a processor such as a microcomputer and a peripheral circuit such as a memory. Also, various functions are implemented by these pieces of hardware working cooperatively with a program executed on a processor such as a computer.

The overall control device Ct gives various instructions such as a transport instruction, a cleaning instruction, and a dust collection instruction to each of the transport vehicle control device C3, the cleaning vehicle control device C1, and the maintenance facility control device C2. The transport vehicle control device C3 and the cleaning vehicle control device C1 transmit signals indicating the positions of their vehicles and the operating states of their vehicles to the overall control device Ct. The maintenance facility control device C2 transmits a signal indicating the operating state of the maintenance facility 2 to the overall control device Ct. Thus, the overall control device Ct can be aware of the state of each of the various devices in the facility, and give various instructions to the control devices based on the state of the device.

The transport vehicle control device C3 is configured to control the operations of the travel mechanism 30 and the transfer mechanism 31 based on the transport instruction and the like from the overall control device Ct.

The cleaning vehicle control device C1 controls the operations of the travel mechanism 10, the air flow generation portion G, and the flow path switching mechanism 17 based on the cleaning instruction and the like from the overall control device Ct.

In the present embodiment, in the case of causing the cleaning vehicle 1 to perform suction of dust on the travel path R by the suction portion 14, the cleaning vehicle control device C1 brings the flow path switching mechanism 17 into the first state, and also generates the suction air flow Fi by using the air flow generation portion G (see FIG. 3). Accordingly, dust deposited on the travel path R, more specifically, the rails Ra is sucked up and stored in the storage portion 15.

In the present embodiment, the cleaning vehicle control device C1 determines whether or not the storage state is the discharge-required state in which the dust needs to be discharged from the storage portion 15, based on a result of detection by the storage state detection portion 18, and, if it is determined that the storage state is the discharge-required state, causes the cleaning vehicle 1 to travel to the maintenance stop position A and to stop, and causes the discharge portion 16 to discharge the dust at the maintenance stop position A. As described above, in the present example, it is determined that the storage state is the discharge-required state, if the pressure detected by the storage state detection portion 18 is less than or equal to a specified value.

In the present embodiment, in the case of causing the cleaning vehicle 1 to discharge dust via the discharge portion 16 at the maintenance stop position A, the cleaning vehicle control device C1 brings the flow path switching mechanism 17 into the second state, and also generates the discharge air flow Fo by using the air flow generation portion G (see FIG. 4). Consequently, as shown in FIG. 8, the dust is discharged to the outside of the cleaning vehicle 1 through the discharge port 161. The dust discharged to the outside of the cleaning vehicle 1 is released into the casing 22, and is collected by the dust collection portion 214.

In the present embodiment, the cleaning vehicle control device C1 causes the cleaning vehicle 1 at the maintenance stop position A to discharge dust via the discharge portion 16, and thereafter causes the storage state detection portion 18 to perform detection, and, if it is determined, based on a result of the detection, that the storage state is not the discharge-required state, causes the cleaning vehicle 1 to depart from the maintenance stop position A so as to resume cleaning of the travel path R. In the present example, the cleaning vehicle control device C1 causes the cleaning vehicle 1 to discharge dust via the discharge portion 16 at the maintenance stop position A, and thereafter brings the flow path switching mechanism 17 into the first state, and also causes the storage state detection portion 18 to perform detection in a state in which the suction air flow Fi is generated by the air flow generation portion G (see FIG. 3). Then, if the pressure detected by the storage state detection portion 18 is greater than a predetermined specified value, the cleaning vehicle control device C1 determines that the storage state is not the discharge-required state, and causes the cleaning vehicle 1 to resume cleaning of the travel path R. Note that if it is determined, based on a result of the detection by the storage state detection portion 18, that the storage state is the discharge-required state, the cleaning vehicle control device C1 again causes the cleaning vehicle 1 to discharge dust via the discharge portion 16.

The maintenance facility control device C2 is configured to control the operations of the shutter 222, the cleansing portion 213, and the dust collection portion 214 based on a dust collection instruction or a cleaning instruction from the overall control device Ct.

In the present embodiment, as shown in FIG. 5, before a cleaning vehicle 1 (this may be a transport vehicle 3 in the case of a cleaning instruction) to which a dust collection instruction has been given arrives at the maintenance stop position A, the maintenance facility control device C2 brings the shutter body 222A of the shutter 222 to the open position so as to open the opening 221 of the side panel 22S. Note that FIG. 5 shows a state in which the shutter body 222A is at the closed position. In the present embodiment, the maintenance facility control device C2 brings the shutter body 222A to the open position so as to open the opening 221, when the cleaning vehicle 1 is stopped short of the maintenance stop position A, or in other words, short of the casing 22. The maintenance facility control device C2 is configured to be aware of the state in which the cleaning vehicle 1 is stopped short of the maintenance stop position A, by communicating with the cleaning vehicle control device C1 (this may be the transport vehicle control device C3 in the case of the cleaning instruction) or the overall control device Ct. However, the maintenance facility control device C2 may be configured to detect the state in which the cleaning vehicle 1 is stopped short of the maintenance stop position A by using a sensor. Once the cleaning vehicle 1 enters the inside of the casing 22 and is stopped at the maintenance stop position A, the maintenance facility control device C2 brings the shutter body 222A of the shutter 222 to the closed position so as to close the opening 221 of the side panel 22S.

Also, as shown in FIG. 8, after a cleaning vehicle 1 (this may be a transport vehicle 3 in the case of the cleaning instruction) to which a dust collection instruction has been given has been stopped at the maintenance stop position A, the maintenance facility control device C2 causes the cleansing portion 213 to cleanse the cleaning vehicle 1, and also causes the dust collection portion 214 to collect dust. Then, if the cleaning vehicle control device C1 determines that the storage state is not the discharge-required state, the maintenance facility control device C2 brings the shutter body 222A of the shutter 222 to the open position so as to open the opening 221 of the side panel 22S (see FIG. 5). The maintenance facility control device C2 is configured to be aware that the cleaning vehicle control device C1 has determined that the storage state is not the discharge-required state, by communicating with the cleaning vehicle control device C1 or the overall control device Ct.

Next, the procedure for dust processing performed by the cleaning system will be described with reference to the flowchart shown in FIG. 9.

The cleaning vehicle 1 sucks up the dust on the travel path R to clean the travel path R (#1). Then, the cleaning vehicle control device C1 determines whether or not the state of the storage portion 15 is the discharge-required state (#2). A determination as to whether or not the state is the discharge-required state may be made, for example, each time a certain period has elapsed, or each time the cleaning vehicle 1 has traveled a certain distance. If the cleaning vehicle control device C1 has determined that the state is not the discharge-required state (#2:N), the cleaning vehicle 1 continues to clean the travel path R (#1). If the cleaning vehicle control device C1 has determined that the storage state is the discharge-required state (#2:Y), the cleaning vehicle 1 travels to the maintenance stop position A (#3).

After the cleaning vehicle 1 has traveled to the maintenance stop position A and been stopped, the discharge portion 16 discharges dust (#4). Then, the maintenance facility 2 cleanses the cleaning vehicle 1 by using the cleansing portion 213 and collects dust by using the dust collection portion 214 (#5, #6). Thereafter, the cleaning vehicle control device C1 determines whether or not the discharge-required state has been cleared (#7). If the cleaning vehicle control device C1 has determined that the discharge-required state has not been cleared (#7:N), the discharge of dust (#4) is resumed, and the cleansing (#5) of the cleaning vehicle 1 and the dust collection (#6) are continued. If the cleaning vehicle control device C1 has determined that the discharge-required state has been cleared (#7:Y), the cleaning vehicle 1 resumes cleaning of the travel path R (#8).

Other Embodiments

Next, other embodiments of the cleaning system will be described.

(1) In the above embodiment, a description has been given of an example in which the first pipe P1 including the suction port 141 and the second pipe P2 including the discharge port 161 are connected by the branch portion Pd. However, the present disclosure is not limited to such an example, and the first pipe P1 and the second pipe P2 may be provided independent of each other, and do not need to be connected to each other. In this case, an end of the first pipe P1 that is located opposite to the suction port 141, and an end of the second pipe P2 that is located opposite to the discharge port 161 are both configured to be open to the storage portion 15. Also, the entire first pipe P1 constitutes a part of the suction flow path Wi. In addition, the entire second pipe P2 constitutes a part of the discharge flow path Wo.

(2) In the above embodiment, a description has been given of an example in which the air flow generation portion G includes the fan Ga, and the driving portion (not shown) that drives the fan Ga. However, the present disclosure is not limited to such an example, and the air flow generation portion G may be formed, for example, using a pump or the like that does not include the fan Ga.

(3) In the above embodiment, a description has been given of an example in which the air flow generation portion G is shared between the suction portion 14 and the discharge portion 16. However, the present disclosure is not limited to such an example, and the suction portion 14 may include a dedicated air flow generation portion G that generates the suction air flow Fi, and, separately from this, the discharge portion 16 may include a dedicated air flow generation portion G that generates the discharge air flow Fo. In this case, the discharge air flow Fo is not limited to an air flow in a direction opposite to the suction air flow Fi. The relationship between the direction in which the discharge air flow Fo flows and the direction in which the suction air flow Fi flows varies depending on the placement position of the air flow generation portions G that generate each of the air flows, and can be set freely.

(4) In the above embodiment, a description has been given of an example in which the storage state detection portion 18 is configured to detect, as the storage state of dust, the pressure on the air flow generation portion G side of the suction flow path Wi relative to the filter 142 while the suction air flow Fi is generated. However, the present disclosure is not limited to such an example, and the storage state detection portion 18 may be configured to detect the pressure on the suction port 141 side of the suction flow path Wi relative to the filter 142 while the suction air flow Fi is generated. When the overall suction air flow Fi is slowed down as a result of the filter 142 being clogged with dust, not only the pressure on the air flow generation portion G side of the suction flow path Wi relative to the filter 142, but also the pressure on the suction port 141 side changes. In the above-described alternative example, the storage state of dust can also be detected using such a pressure change.

(5) In the above embodiment, a description has been given of an example in which the storage state detection portion 18 is configured as a pressure sensor that detects the pressure in the internal space of the body portion 11, and the storage state of dust in the storage portion 15 is detected by detecting the pressure in the internal space of the body portion 11. However, the present disclosure is not limited to such an example, and the storage state detection portion 18 may be configured to, for example, measure the time elapsed from the start of sucking up of dust on the travel path R by the suction portion 14, and detect the storage state of dust in the storage portion 15 according to the elapsed time. It can be determined that the longer the elapsed time, the larger the amount of dust stored in the storage portion 15 is. In the aforementioned case, it is preferable that the cleaning vehicle control device C1 (control unit) determines that the storage state is the discharge-required state, if the above-described elapsed time measured by the storage state detection portion 18 exceeds a predetermined specified time. It is also preferable that the storage state detection portion 18 is configured using, for example, a transmissive photosensor, measures the amount of light transmitting through the filter 142, and determines that the storage state is the discharge-required state, if the amount of the light is less than or equal to a specified amount.

(6) In the above embodiment, a description has been given of an example in which the maintenance facility 2 collects, in parallel with cleansing of the cleaning vehicle 1 performed by the cleansing portion 213, the dust discharged from the cleaning vehicle 1 by using the dust collection portion 214. However, the present disclosure is not limited to such an example, and the maintenance facility 2 may cleanse the cleaning vehicle 1 by using the cleansing portion 213 and collect the dust by using the dust collection portion 214 at different times. That is, the maintenance facility 2 may only cleanse the cleaning vehicle 1 using the cleansing portion 213, or may only collect dust using the dust collection portion 214.

(7) In the above embodiment, a description has been given of an example in which the cleaning vehicle control device C1 corresponds to the "control unit", determines whether or not the storage state is the discharge-required state in which the dust needs to be discharged from the storage portion 15, based on a result of detection by the storage state detection portion 18, and controls the cleaning vehicle 1. However, the present disclosure is not limited to such an example, and, for example, the overall control device Ct that manages the entire facility may determine whether or not the storage state is the discharge-required state, based on information received from the cleaning vehicle control device C1. In this case, the overall control device Ct corresponds to the "control unit". Note that it is possible to adopt a configuration in which a combination of the cleaning vehicle control device C1 and the overall control device Ct may correspond to the "control unit".

(8) In the above embodiment, a description has been given of an example in which the cleaning system is applied to a ceiling transport facility serving as the article transport facility. However, the present disclosure is not limited to such an example, and the article transport facility to which the cleaning system is applied may be a facility that transports the article 8 on a floor surface, for example. In this case, the transport vehicle 3 is configured to travel along a travel path R provided on the floor surface to transport the article 8. Also, the cleaning vehicle 1 is configured to clean the travel path R provided on the floor surface.

(9) Note that the configurations disclosed in the embodiments described above are applicable in combination with configurations disclosed in other embodiments as long as no inconsistency arises. With regard to the other configurations as well, the embodiments disclosed herein are illustrative in all respects. Therefore, various modifications and alterations may be made as appropriate without departing from the gist of the present disclosure.

OUTLINE OF THE EMBODIMENTS

The following is a description of the cleaning system described above.

The cleaning system includes:

a cleaning vehicle that travels along a predetermined travel path to clean the travel path; and a maintenance facility provided at a maintenance stop position set on the travel path, wherein the cleaning vehicle includes a suction portion that sucks up dust on the travel path, a storage portion that stores the sucked up dust, and a discharge portion that discharges the dust stored in the storage portion to the outside, and the maintenance facility includes a dust collection portion that collects the dust discharged to the outside from the storage portion via the discharge portion of the cleaning vehicle stopped at the maintenance stop position.

With this configuration, the cleaning vehicle can travel to the maintenance stop position by itself after sucking up the dust on the travel path, and discharge the dust stored in the storage portion to the outside at the maintenance stop position. Then, the dust discharged from the cleaning vehicle can be automatically collected by the dust collection portion of the maintenance facility. Thus, with this configuration, the dust collected by the cleaning vehicle can be automatically processed. Accordingly, it is possible to reduce the burden on the operator at the time of processing the dust collected by the cleaning vehicle.

Here, it is preferable that the suction portion includes a suction port formed so as to open toward the travel path and connected to the storage portion, an air flow generation portion that generates a suction air flow for sucking up the dust through the suction port, and a filter, the storage portion and the filter are disposed on a suction flow path connecting the suction port and the air flow generation portion, and the storage portion is provided in a region of the suction flow path on the suction port side relative to the filter.

With this configuration, the dust that has been sucked from the suction port by the suction air flow and is flowing through the suction flow path can be captured by the filter. Accordingly, the dust can be appropriately stored in the storage portion provided in a region of the suction flow path on the suction port side relative to the filter.

It is preferable that the discharge portion includes a discharge port connected to the storage portion, and the air flow generation portion shared with the suction portion, and the discharge portion generates a discharge air flow that is an air flow that moves in a direction opposite to a direction in which the suction air flow is generated by the air flow generation, thereby discharging, from the discharge port, the dust that has been captured by the filter and is stored in the storage portion.

With this configuration, the air flow generation portion can be used in a shared manner for sucking and discharging dust, and it is thus possible to easily make the cleaning vehicle more compact by reducing the number of components thereof. With this configuration, due to the shared use of the air flow generation portion, a discharge air flow moving in a direction opposite to the suction air flow can be generated from the same position as the position as in the case of sucking dust. Accordingly, the dust captured by the filter during sucking can be separated from the filter by the discharge air flow, and easily discharged from the discharge port in an appropriate manner.

It is preferable that the cleaning vehicle further includes:

a branch portion that branches the suction flow path and a discharge flow path connecting the discharge port and the air flow generation portion, and a flow path switching mechanism disposed at the branch portion, and the flow path switching mechanism is switchable between a first state of allowing communication between the suction port and the storage portion and blocking communication between the discharge port and the storage portion, and a second state of blocking communication between the suction port and the storage portion and allowing communication between the discharge port and the storage portion.

With this configuration, in the first state of the flow path switching mechanism, the suction port and the storage portion are in communication, and communication between the discharge port and the storage portion is blocked. Accordingly, dust that has been sucked up can be appropriately stored in the storage portion, without being discharged through the discharge port. In the second state of the flow path switching mechanism, communication between the suction port and the storage portion is blocked, and the discharge port and the storage portion are in communication. Accordingly, the dust that is being discharged can be appropriately discharged from the discharge port, without being discharged from an unintended location through the suction port. Such switching of the flow path can be realized with a relatively simple configuration such as a switching mechanism provided at a branch portion.

It is preferable that the cleaning system further includes a control unit that controls the cleaning vehicle, wherein the cleaning vehicle further includes a storage state detection portion that detects a storage state of dust in the storage portion, and the control unit determines, based on a result of detection by the storage state detection portion, whether or not the storage state is a discharge-required state in which the dust needs to be discharged from the storage portion, and, if it is determined that the storage state is the discharge-required state, the control unit causes the cleaning vehicle to travel to and stop at the maintenance stop position, and causes the discharge portion to discharge the dust at the maintenance stop position.

With this configuration, if the control unit determines, based on a result of detection by the storage state detection portion, that the storage state is the discharge-required state, the control unit directs the cleaning vehicle toward the maintenance stop position and causes the cleaning vehicle to discharge the dust. On the other hand, until the control unit determines that the storage state is the discharge-required state, the control unit can continue to collect dust on the travel path via the cleaning vehicle. Accordingly, with this configuration, the collection and discharge of dust on the travel path via the cleaning vehicle can be efficiently performed.

It is preferable that the storage state detection portion detects, as the storage state, pressure on the air flow generation portion side of the suction flow path relative to the filter while the suction air flow is generated, and the control unit determines that the storage state is the discharge-required state, if the pressure detected by the storage state detection portion is less than or equal to a specified value.

When the amount of the dust stored in the storage portion increases, a large amount of dust is attached to the filter, thus making it difficult for the suction air flow to pass through the filter. Consequently, the pressure on the air flow generation portion side relative to the filter is reduced. By utilizing this, the control unit in this configuration determines that the storage state is the discharge-required state, if the pressure on the air flow generation portion side of the suction flow path relative to the filter is less than or equal to a specified value. Thus, with this configuration, whether or not the storage state is the discharge-required state can be appropriately determined based on a pressure change that can be easily detected by a pressure sensor or the like.

It is preferable that the control unit causes the cleaning vehicle to discharge the dust via the discharge portion at the maintenance stop position, and thereafter causes the storage state detection portion to perform detection, and, if it is determined, based on a result of the detection, that the storage state is not the discharge-required state, causes the cleaning vehicle to depart from the maintenance stop position to resume the cleaning of the travel path.

With this configuration, the cleaning of the travel path by the cleaning vehicle after discharging the dust can be automatically resumed. Accordingly, with this configuration, the burden on the operator can be reduced also at the time of resuming the cleaning by the cleaning vehicle.

It is preferable that the cleaning system is provided in an article transport facility including a transport vehicle that transports an article, and the maintenance facility includes a cleansing portion that cleanses the cleaning vehicle and the transport vehicle at the maintenance stop position, and, if the cleaning vehicle is stopped at the maintenance stop position, collects, in parallel with cleansing of the cleaning vehicle performed by the cleansing portion, the dust discharged from the cleaning vehicle by using the dust collection portion.

With this configuration, the cleansing of the cleaning vehicle and the processing of the dust collected by the cleaning vehicle can be performed in parallel. Furthermore, the cleaning system can be easily used in existing article transport facilities, for example.

A technique according to the present disclosure is applicable to a cleaning system including a cleaning vehicle that travels along a predetermined travel path to clean the travel path.

DESCRIPTION OF REFERENCE SIGNS

1: Cleaning vehicle
14: Suction portion
15: Storage portion
16: Discharge portion
17: Flow path switching mechanism
18: Storage state detection portion
141: Suction port
142: Filter
161: Discharge port
2: Maintenance facility
213: Cleansing portion
214: Dust collection portion
3: Transport vehicle
G: Air flow generation portion
Fi: Suction air flow
Fo: Discharge air flow
Wi: Suction flow path
Wo: Discharge flow path
Pd: Branch portion
8: Article
R: Travel path
A: Maintenance stop position

What is claimed is:

1. A cleaning system comprising:
a cleaning vehicle that travels along a predetermined travel path including a rail to clean the travel path; and
a maintenance facility provided at a maintenance stop position set on the travel path,
wherein the cleaning vehicle comprises:
a suction portion that sucks up dust on the travel path;
a storage portion that is disposed below the rail and stores the sucked up dust;
a discharge portion that discharges the dust stored in the storage portion to the outside; and
a travel mechanism, for traveling along the travel path, that is disposed above the rail,
wherein the maintenance facility comprises a dust collection portion that collects the dust discharged to the outside from the storage portion via the discharge portion of the cleaning vehicle stopped at the maintenance stop position,
wherein the suction portion comprises:
a suction port formed so as to open toward the travel path and connected to the storage portion;
an air flow generation portion that generates a suction air flow for sucking up the dust through the suction port; and
a filter,
wherein the discharge portion comprises a discharge port connected to the storage portion and the air flow generation portion shared with the suction portion,
wherein the storage portion and the filter are disposed on a suction flow path connecting the suction port and the air flow generation portion,
wherein the storage portion is provided in a region of the suction flow path on the suction port side relative to the filter,
wherein the discharge portion generates a discharge air flow that is an air flow that moves in a direction opposite to a direction in which the suction air flow is generated by the air flow generation, thereby discharging, from the discharge port, the dust that has been captured by the filter and is stored in the storage portion,
wherein the cleaning vehicle further comprises:
a body portion coupled to the travel mechanism;
a cover portion covering a top and lateral sides of the body portion; and
a pipe constituting a part of a discharge flow path between the discharge port and the air flow generation portion,
wherein the air flow generation portion, the filter, the storage portion, and a proximal end of the pipe are arranged in order from bottom to top inside the body portion, and
wherein at least a portion of the pipe extends along directions in which the cover portion extends such that the pipe extends in an area surrounding the body portion, and a distal end of the pipe serves as the discharge port.

2. The cleaning system according to claim 1,
wherein the cleaning vehicle further comprises:
a branch portion that branches the suction flow path and a discharge flow path connecting the discharge port and the air flow generation portion; and
a flow path switching mechanism disposed at the branch portion, and
wherein the flow path switching mechanism is switchable between a first state of allowing communication between the suction port and the storage portion and blocking communication between the discharge port and the storage portion, and a second state of blocking communication between the suction port and the storage portion and allowing communication between the discharge port and the storage portion.

3. The cleaning system according to claim 1, further comprising:
a control unit that controls the cleaning vehicle,
wherein the cleaning vehicle further comprises a storage state detection portion that detects a storage state of dust in the storage portion, and
wherein the control unit determines, based on a result of detection by the storage state detection portion, whether or not the storage state is a discharge-required state in which the dust needs to be discharged from the storage portion and, if it is determined that the storage state is the discharge-required state, the control unit causes the cleaning vehicle to travel to and stop at the maintenance stop position, and causes the discharge portion to discharge the dust at the maintenance stop position.

4. The cleaning system according to claim 3,
wherein the storage state detection portion detects, as the storage state, pressure on the air flow generation portion side of the suction flow path relative to the filter while the suction air flow is generated, and
wherein the control unit determines that the storage state is the discharge-required state, if the pressure detected by the storage state detection portion is less than or equal to a specified value.

5. The cleaning system according to claim 3,
wherein the control unit causes the cleaning vehicle to discharge the dust via the discharge portion at the maintenance stop position, and thereafter causes the storage state detection portion to perform detection and, if it is determined, based on a result of the detection, that the storage state is not the discharge-required state, causes the cleaning vehicle to depart from the maintenance stop position to resume the cleaning of the travel path.

6. The cleaning system according to claim 1,
wherein the cleaning system is provided in an article transport facility comprising a transport vehicle that transports an article, and
wherein the maintenance facility comprises a cleansing portion that cleanses the cleaning vehicle and the transport vehicle at the maintenance stop position and, if the cleaning vehicle is stopped at the maintenance stop position, collects, in parallel with cleansing of the cleaning vehicle performed by the cleansing portion, the dust discharged from the cleaning vehicle by using the dust collection portion.

7. The cleaning system according to claim 6, wherein:
the maintenance facility includes a fan filter unit,
the cleansing portion causes dust attached to the cleaning vehicle to fall off inside the maintenance facility, and
the fan filter unit is disposed below the cleaning vehicle stopped at the maintenance stop position and configured to suck up at least two types of dust, including dust caused to fall from the cleaning vehicle by the cleansing portion and dust discharged from the discharge port.

* * * * *